United States Patent [19]

Hayakawa

[11] Patent Number: 5,289,484
[45] Date of Patent: Feb. 22, 1994

[54] LASER DIODE

[75] Inventor: Toshiro Hayakawa, Yokohama, Japan

[73] Assignee: Eastman Kodak Company, Rochester, N.Y.

[21] Appl. No.: 923,763

[22] Filed: Aug. 3, 1992

[30] Foreign Application Priority Data

Mar. 25, 1992 [JP] Japan .................... 4-67565

[51] Int. Cl.⁵ .................................... H01S 3/19
[52] U.S. Cl. ........................................... 372/45
[58] Field of Search ................................ 372/45

[56] References Cited

U.S. PATENT DOCUMENTS

| 4,585,491 | 4/1986 | Burnham et al. | 372/45 |
| 4,745,612 | 5/1985 | Hayakawa et al. | 372/45 |
| 4,862,470 | 8/1989 | Suyama et al. | 372/45 |

FOREIGN PATENT DOCUMENTS

| 0156788 | 7/1986 | Japan | 372/45 |
| 0239689 | 10/1986 | Japan | 372/45 |
| 0076288 | 4/1991 | Japan | 372/45 |

OTHER PUBLICATIONS

W. T. Tsang, "Semiconductors and Semimetals," vol. 24, pp. 397, Ed. R. Dingle, Academic Press, San Diego (1987).

L. Figueroa, "Handbook of Microwave and Optical Components," vol. 3, Optical Components, pp. 246-252, edited by K. Chang, Wiley-Interscience Publications, New York (1990).

M. C. Wu et al, Applied Physics Letters, vol. 59, p. 1046 (1991).

T. M. Cockerill et al, Applied Physics Letters, vol. 59, p. 2694 (1991).

Primary Examiner—Georgia Y. Epps
Attorney, Agent, or Firm—Raymond L. Owens

[57] ABSTRACT

A high efficiency laser diode that has a narrow beam divergence in a direction perpendicular with respect to the substrate, and a low threshold current.

2 Claims, 7 Drawing Sheets

LASER DIODE

CROSS REFERENCE TO RELATED APPLICATION

Reference is made to commonly assigned U.S. patent application Ser. No. 902,212 filed Jun. 22, 1991 to Hayakawa.

BACKGROUND OF THE INVENTION

1. Field of the Invention

The present invention relates to laser diodes, and more particularly to laser diodes having a narrow beam divergence and improved coupling efficiency with an optical system comprised of optical fibers, lenses and the like.

2. Description of the Prior Art

In recent years optical communication technology and optical information processing are playing major roles in various fields. Digital optical communication using optical fibers has made possible large increases in data communication densities, and optical disks and laser printers have produced a considerable expansion of the range of optical information processing applications. The progress of optical communications and optical information processing technology owes much to advances made in the laser diodes used as light sources. The small size and high efficiency that are features of laser diodes have brought these devices into widespread use, for example as light sources for compact disk systems, video disk systems and optical communication networks. In a laser diode the lasing action is generated by the injection of carriers into the P-N junction constituting the active layer. Recent advances in semiconductor technology such as MBE (molecular beam epitaxy) and MOCVD (metal-organic chemical vapor deposition) that make it possible to form epitaxial layers as thin as 1 nm or less, have led to the realization of laser diodes that use quantum well active layers less than 20 nm thick, with higher levels of efficiency and lower drive current requirements (see W. T. Tsang in "Semiconductors and Semimetals," vol. 24, pp 397, Ed. R. Dingle, Academic Press, San Diego (1987)).

Compared to gas lasers or ordinary solidstate lasers, the major feature of laser diodes is their small size and high efficiency. However, when incorporated into an actual system the laser beam has to be coupled with some form of optical system. Viewed from the system side the problem concerns the overall characteristics of the laser diode, including the coupling characteristics relative to the optical system. In general it is difficult to achieve high coupling efficiency owing to the beam having a wide beam divergence of 30 degrees or more and, rather than being isotropic, having a spatial asymmetry of 1:2 to 1:3 or more. Especially in recent years, when used as excitation sources for optical fiber amplifiers in communication systems or to excite solid-state lasers, high optical-coupling efficiency into a small region is becoming increasingly important. Also, in such applications as these in which high output power is required, a low coupling efficiency has to be offset by raising the optical output power of the laser diode accordingly, which lowers the reliability of the laser diode and, therefore, the reliability of the whole system.

The structure of prior laser diodes is a multilayer arrangement of semiconductor material formed by epitaxially growing the operating layers, including an optical waveguide layer structure, on a substrate. Such a structure results in a large variation in the index of refraction along a direction perpendicular to the substrate which, with the different layers, produces a strong optical confinement effect, so that when the light spot diameter is 1 $\mu$m or less, diffraction gives rise to a large beam divergence angle of 20 to 30 degrees or more. In contrast, in a direction parallel to the substrate, in nearly all cases other than buried structures, the optical confinement is the result of the equivalent of changes in the index of refraction based on the differences in propagation constant produced by changes in the thickness of the layers, and as such the confinement effect is weak. Moreover, the waveguide structure is fabricated mainly using a photolithographic fabrication process that produces a waveguide width in the order of 2 to 5 $\mu$m, and as a result the spot diameter increases to about the same size and, also, the weak diffraction causes a narrowing of the beam divergence angle to around 10 degrees or less. (See L. Figueroa in "Handbook of Microwave and Optical Components," vol. 3, Optical Components, pp 246-252, edited by K. Chang, Wiley-Interscience Publications, New York (1990)).

In order to improve the coupling efficiency between the diode and the optical system, first it is important to reduce the beam divergence along the direction perpendicular to the substrate. Generally this is done by reducing the thickness of the layers adjacent to the active region that have a high index of refraction, causing the light to penetrate into the low-refractive-index cladding regions around the beam and increasing the diameter of the light spot. However, the result of this is that the quantity of photons confined in the active layer is reduced by the amount by which the beam size is increased, thereby reducing the confinement factor and increasing the threshold current needed for oscillation to take place. In particular, in the case of quantum well active layer decrease in the confinement factor caused by the rapid saturation of the gain that accompanies an increase in injection carriers produces a considerable increase in the threshold current. While there is a method of compensating for this gain saturation by optimizing the number of quantum wells at around two or three, the threshold current increases with the increase in the number of quantum wells.

To overcome the drawbacks of the laser diodes described above, a laser diode has been proposed in which the cladding is a multilayer structure having a periodic refractive index differential (see M. C. Wu, et al., Applied Physics Letters, vol. 59, page 1046 (1991)). This PINSCH (for Periodic Index Separate Confinement Heterostructure) laser uses the same principle as a $\lambda/4$ shift DFB laser to prevent high-order mode oscillation from taking place even when there is an increase in beam diameter in the perpendicular direction. However, the drawback of this structure is that fabricating each of the layers making up the periodic index cladding structure requires highprecision control of layer composition and thickness, and in addition there has to be a gradual change in layer composition at the interfaces between layers in order to suppress increases in electrical resistance that can give rise to energy barriers in the multilayer structure. Another method involves reducing beam divergence by the addition to the waveguide region of layers having a lower refractive index (see T. M. Cockerill et al., Applied Physics Letters, vol. 59, page 2694 (1991)).

However, tests on beam divergence in the perpendicular direction produced a full-width at half maximum of 27 degrees and a threshold current density of 309 A/cm$^2$ (with a resonator length of 780 μm), inferior to an ordinary quantum well laser beam divergence angle of 35 degrees and threshold current density of 200 A/cm$^2$. With this method, also, as the width of the diffracted far-field image pattern is reduced by raising the base of the optical waveguide mode, the intensity of the light confined in the cladding layers decays slowly, so that unless the cladding layers are quite thick, 2 or 3 μm or more, the result, with the further absorption of the light by the buffer and cap layers beyond the cladding layers, is a large coupling loss. Moreover, the deep etching that has to be used when the active layer is overlaid with thick layers makes it difficult to fabricate lasers with graded-index and other types of waveguide structures.

SUMMARY OF THE INVENTION

To overcome these drawbacks, the present inventor has developed an arrangement in the above-identified co-pending patent application in which buffer and cap layers are used that have an energy gap that is higher than the energy of the lasing light, preventing band-to-band absorption in layers located on the outer side of the cladding layers and thereby eliminating coupling loss caused by such absorption. However, the materials that can be used for this are extremely limited, which in turn limits the applicable laser oscillation wavelengths. For example, in the case of the widely-used AlGaAs laser diode that uses a GaAs substrate, as GaAs is used for the buffer layers and cap layer, the above arrangement cannot be applied to a GaAs or AlGaAs active layer device with a wavelength shorter than 870 nm.

An object of the present invention is therefore to provide a high efficiency laser diode that has a narrow beam divergence in the perpendicular direction and low threshold current.

In accordance with the present invention, the above object is attained in an optical waveguiding multilayer structure laser diode, comprising:

a) an optical waveguiding region having at least one high refractive index layer;

b) two spaced cladding regions that sandwich between them the optical waveguiding region, each cladding region including: a first cladding layer adjacent to the waveguiding region and having a lower refractive index than the waveguiding region; a first low refractive index layer having a refractive index lower than the first cladding layer; a second cladding layer adjacent to the first low refractive layer and a second low refractive layer adjacent to the second cladding layer and having a refractive index lower than the first; and c) a low refractive index electrode layered structure connected to each cladding region, with each layer of the electrode structures having a lower index of refraction than any of the cladding region layers.

DESCRIPTION OF THE PREFERRED EMBODIMENT

Figure 1:
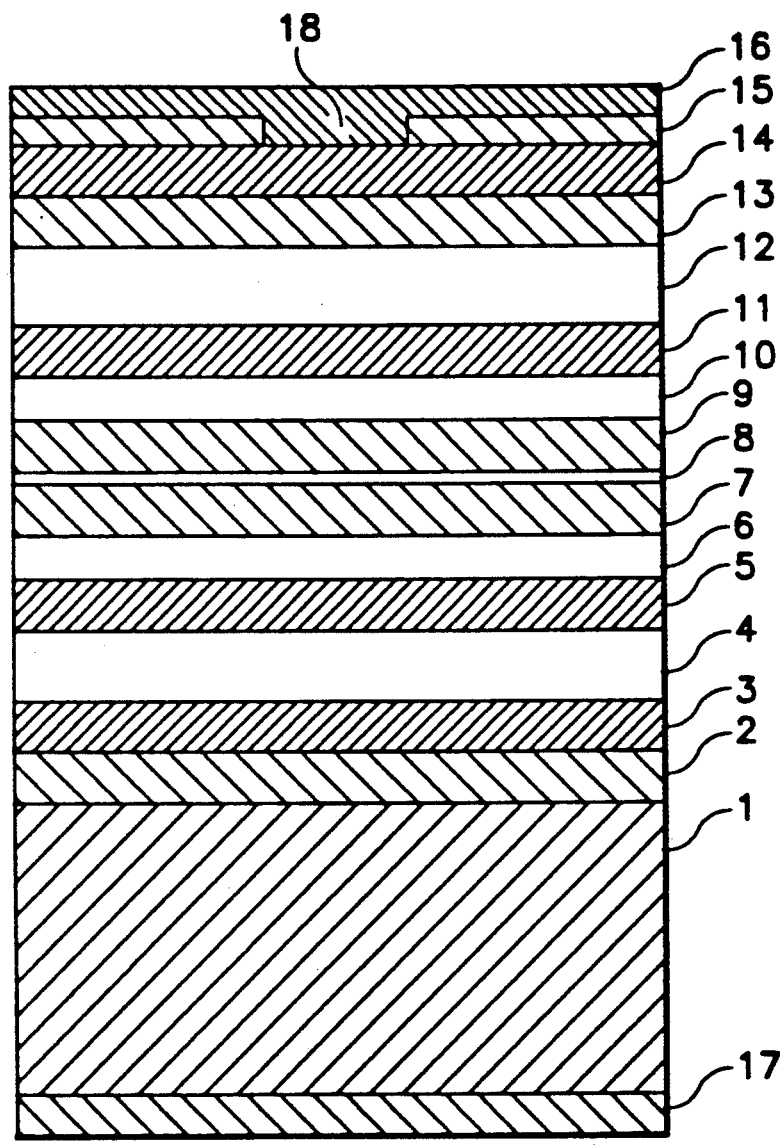
FIG. 1 is a cross-sectional view of a laser diode according to a first embodiment of the invention.

FIG. 1 is a cross-sectional view of a GaAs/AlGaAs strained quantum well laser according to a first embodiment of the invention. With reference to the drawing, molecular beam epitaxy (MBE) was used to form an n-GaAs buffer layer 2 (Si=1×10$^{18}$ cm$^{-3}$, 0.7 μm thick) on an n-GaAs substrate 1 (Si=2×10$^{18}$ cm$^{-3}$) with a (100) orientation, and this was followed by the formation of an n-Al$_{0.85}$Ga$_{0.15}$As low refractive index layer 3 (Si=1×10$^{18}$ cm$^{-3}$, 0.1 μm thick), an n-Al$_{0.45}$Ga$_{0.55}$As cladding layer 4 (Si=1×10$^{18}$ cm$^{-3}$, 1.3 μm thick), an n-Al$_{0.7}$Ga$_{0.3}$As low refractive index layer 5 (Si=1×10$^{18}$ cm$^{-3}$, 0.1 μm thick), an n-Al$_{0.45}$Ga$_{0.55}$As cladding layer 6 (Si=1×10$^{18}$cm$^{-3}$, 01 μm thick) a non-doped Al$_{0.2}$Ga$_{0.8}$As optical waveguide 7 (0.06 μm thick), a non-doped GaAs quanttum well active layer 8 (0.01 μm thick), a non-doped A$_{0.2}$Ga$_{0.8}$As optical waveguide layer 9 (0.06 μm thick), a p-Al$_{0.45}$Ga$_{0.55}$As cladding layer 10 (Be=1×10$^{18}$ cm$^3$, 0.1 μm thick), a p-Al$_{0.7}$Ga$_{0.3}$As low refractive index layer 11 (Be=1×10$^{18}$ cm$^{-3}$, 0.1 μm thick), a p-Al$_{0.45}$Ga$_{0.55}$As cladding layer 12 (Be=1×10$^{18}$ cm$^{-3}$, 1.3 μm thick), a p-Al$_{0.85}$Ga$_{0.15}$As low refractive index layer 13 (Be=1×10$^{18}$ cm$^{-3}$, 0.1 μm thick), and a p-GaAs cap layer 14 (Be=1×10$^{19}$ cm$^{-3}$, 0.5 μm thick).

A SiN$_x$ layer 15 (3000 nm thick) was then formed by means of plasma CVD, and photolithography together with chemical etching using dilute HF were then used to remove part of the SiN$_x$ layer so as to form a 50-μm-wide window strip 18. To finish, vacuum deposition was used to form a Mo/Au electrode layer 16 on the p-GaAs cap layer side and a AuGe/Ni/Au electrode layer 17 on the n-GaAs substrate side, which was followed by annealing at 460° C. for five minutes to form ohmic electrodes.

The wafer thus fabricated was cleaved to form a resonator 500 μm long, and electron-beam deposition was then used to provide the front end with an Al$_2$O$_3$ coating having a reflectance of 10% and the rear end with a multilayer coating of 95%-reflectance Al$_2$O$_3$ followed by amorphous silicon, this sequence being then repeated. The wafer was then cut into chips 500 μm wide which were then each In-soldered onto a copper heat sink and the characteristics were measured. At 25° C. the device oscillated at a threshold current of 120 mA, producing an optical output of 500 mW from the front end; oscillation wavelength was around 850 nm. Far-field image measurement from the front end showed a small full-width at half maximum of around 27 degrees in the perpendicular direction.

Figure 2A:
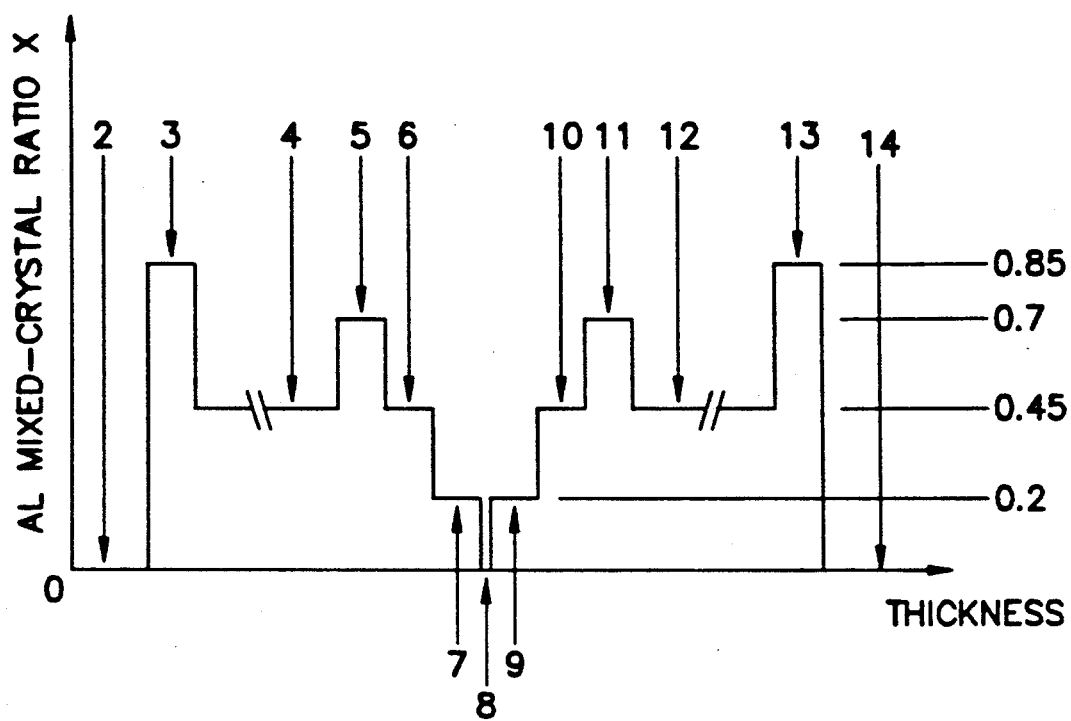
FIGS. 2A and 2B are diagrams showing the distribution of the Al mixed crystal component in the thickness direction of the laser diode of the first embodiment.
Figure 2B:
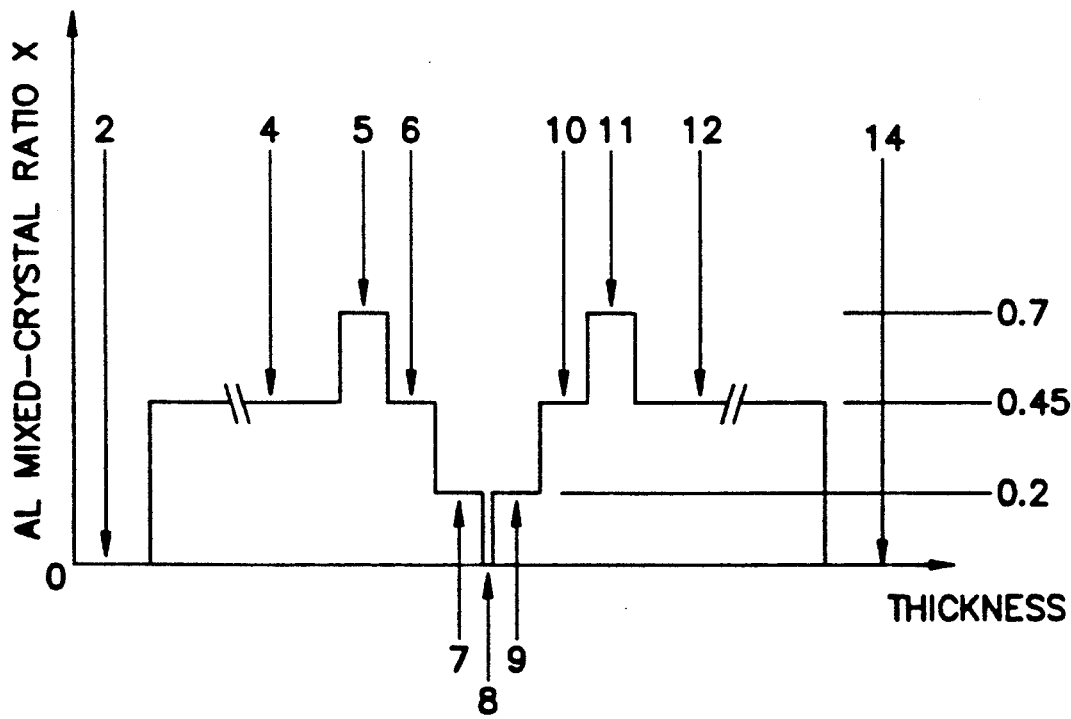
Figure 3:
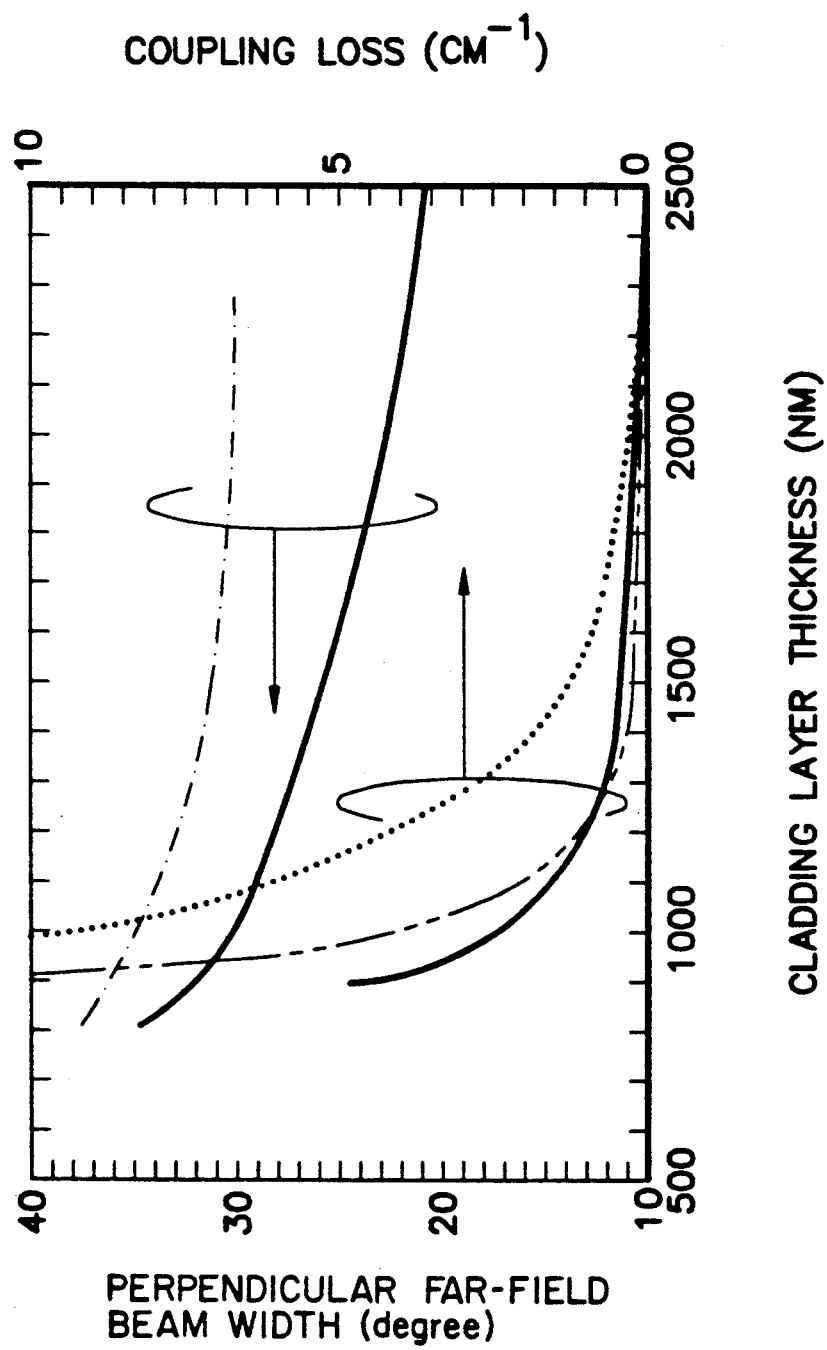
FIG. 3 is a graph illustrating the relationship between the thickness of the cladding layers, the full-width at half maximum of the far-field image in the perpendicular direction, and the coupling loss.

The invention will now be described with reference to theoretical calculations. FIG. 2(A) shows the distribution in the thickness direction of the Al component ratio x in the $Al_xGa_{1-x}As$ layers. For comparison, FIG. 2(B) shows the calculated mixed-crystal ratio distribution of a laser that does not have the low refractive index layers 3 and 13. An oscillation wavelength of 850 nm was used and an absorption coefficient of 7000 cm$^{-1}$ for the GaAs buffer layers 2 and 14. FIG. 3 shows the results of calculating the full-width at half maximum of the farfield image in the perpendicular direction, and the GaAs layer coupling loss as a function of the total thickness of the outer cladding layer 4 (or 12) and n-$Al_{0.85}Ga_{0.15}As$ low refractive index layer 3 (or 13). FIG. 3 only denotes the cladding layer thickness. Here, in the arrangement of the invention shown in FIG. 2(A) the thickness of the n-$Al_{0.85}Ga_{0.15}As$ low refractive index layers 3 and 13 was a set 0.1 μm and the thickness of the cladding layers 4 and 12 was varied. The results obtained with the inventive arrangement of FIG. 2(A) are represented by a solid line, while the results obtained with the arrangement of FIG. 2(B) are represented by a wavy line. For the purposes of comparison, the horizontal axis represents the thickness of the outer cladding layer 4 (or 12) of the FIG. 2(B) arrangement, therefore the distance is the same whether measured from the quantum well active layer 8 to the GaAs layer 2 or 14. Also in FIG. 3, the dotted line indicates computed results based on the arrangement of FIG. 2(B) without the n-$Al_{0.7}Ga_{0.3}As$ low refractive index layers 5 and 11, i.e. an ordinary SCH arrangement. To make it the same as the other two examples, the horizontal axis has used to represent the distance from the quantum well to the GaAs layer. First, the addition of the low refractive index layers 5 and 11 to the SCH arrangement results in a smaller full-width at half maximum of the far-field image. At the same time, however, owing to greater leakage of the electrical field from the cladding layers, there is greater absorption by the GaAs layers, hence a larger coupling loss. In the case of a monomode quantum well laser in which the internal loss for all oscillation modes is in the order of 5 cm$^{-1}$ or less, this is a major increase in the loss. While the coupling loss can also be decreased by increasing the width of the cladding layers, in the case of a precision ridged waveguide or buried type refractive index waveguiding type laser, increasing the thickness of the cladding layers makes the etching process more difficult, which can lower the yield. Thus, with the arrangement according to the present invention in which the outer cladding layer, or the nearby region, is provided with a further low refractive index layer, as shown by the solid line in FIG. 3, the width of the far-field image can be reduced while maintaining the coupling loss at a relatively low level. This is because in this embodiment it is necessary to increase the strength of the electrical field between the low refractive index layers 3 and 5 and 11 and 13 provided in the cladding regions.

Figure 4:
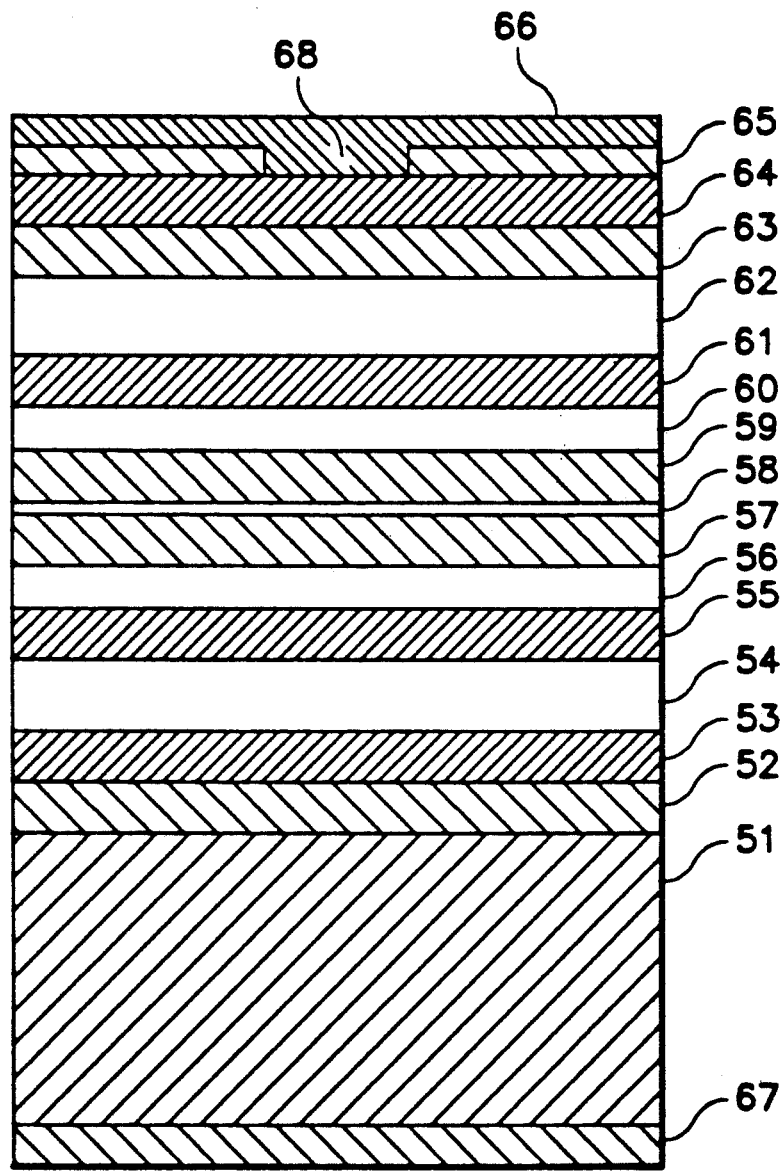
FIG. 4 is a cross-sectional view of a laser diode according to a second embodiment of the invention.

With reference to FIG. 4, molecular beam epitaxy (MBE) was used to form an n-GaAs buffer layer 52 (Si=1×10$^{18}$ cm$^{-3}$, 0.5 μm thick) on an n-GaAs substrate 51 (Si=2×10$^{18}$ cm$^{-3}$) with a (100) orientation, and this was followed by the formation of an n-$Al_{0.6}Ga_{0.4}As$ low refractive index layer 53 (Si=1×10$^{18}$ cm$^{-3}$, 0.1 μm thick), an n-$Al_{0.3}Ga_{0.7}As$ cladding layer 54 (Si=1×10$^{18}$ cm$^{-3}$, 1.3 μm thick), an n-$Al_{0.6}Ga_{0.4}As$ low refractive index layer 55 (Si=1×10$^{18}$ cm$^{-3}$, 0.1 μm thick), an n-$Al_{0.3}Ga_{0.7}As$ cladding layer 56 (si=1×10$^{18}$ cm$^{-3}$, 0.1 μm thick), a non-doped GaAs optical waveguide layer 57 (0.07 μm thick), a nondoped $In_{0.2}Ga_{0.8}As$ strained quantum well active layer 58 (0.006 μm thick), a non-doped GaAs optical waveguide layer 59 (0.07 μm thick), a p-$Al_{0.3}Ga_{0.7}As$ cladding layer 60 (Be=1×10$^{18}$ cm$^{-3}$, 0.1 μm thick), a p-$Al_{0.6}Ga_{0.4}As$ low refractive index layer 61 (Be=1×10$^{18}$ cm$^{-3}$, 0.1 μm thick), a p-$Al_{0.3}Ga_{0.7}As$ cladding layer 62 (Be=1×10$^{18}$ cm$^{-3}$, 0.1 μm thick), a p-$Al_{0.6}Ga_{0.4}As$ low refractive index layer 63 (Be=1×10$^{18}$ cm$^{-3}$, 0.1 μm thick), and a p-GaAs cap layer 64 (Be=1×10$^{19}$ cm$^{-3}$, 0.7 μm thick). As the AlGaAs and InGaAs each have a different optimum growth temperature, the following heating program was used. The growth of the n-GaAs buffer layer 52 proceeded at 620° C. for 0.1 μm and during the growth of the next 0.3 μm the temperature was gradually raised to 720° C. for a further 0.1 μm layer of growth. Then the layers from n-$Al_{0.6}Ga_{0.4}As$ low refractive index layer 53 to n-$Al_{0.3}Ga_{0.7}As$ cladding layer 56 were grown at 720° C., and during growth of the non-doped GaAs optical waveguide layer 57 the temperature was gradually lowered to 500° C., at which the non-doped $In_{0.2}Ga_{0.8}As$ strained quantum well active layer 58 was grown. Next, during the growth of the non-doped GaAs optical waveguide layer 59 the temperature was again gradually raised to 720° C. to grow the layers from the p-$Al_{0.3}Ga_{0.7}As$ cladding layer 60 to p-$Al_{0.6}Ga_{0.4}As$ low refractive index layer 63. Thus fabricating the materials under the respective optimum conditions of a higher temperature for the AlGaAs and a lower temperature for the InGaAs makes it possible to realize good crystallinity. To change the temperature without interrupting the growth process, the growth temperature was changed during GaAs layer formation, GaAs layers having a lower growth temperature dependency than other layers, thereby preventing the boundary degradation that accompanies interruption of the growth process. Moreover, to avoid defects during the MBE process such as stress-induced slip lines, the n-GaAs substrate was affixed to the holder by mechanical means rather than by In solder. A $SiN_x$ layer 65 (300 nm thick) was then formed by means of plasma CVD, and photolithography together with chemical etching using dilute HF were then used to remove part of the $SiN_x$ layer so as to form a 50-μm-wide window strip 68. Finally, vacuum deposition was used to form a Mo/Au electrode layer 66 on the p-GaAs cap layer side and a AuGe/Ni/Au electrode layer 67 on the n-GaAs substrate side, which was followed by annealing at 460° C. for five minutes to form ohmic electrodes.

Figure 5:
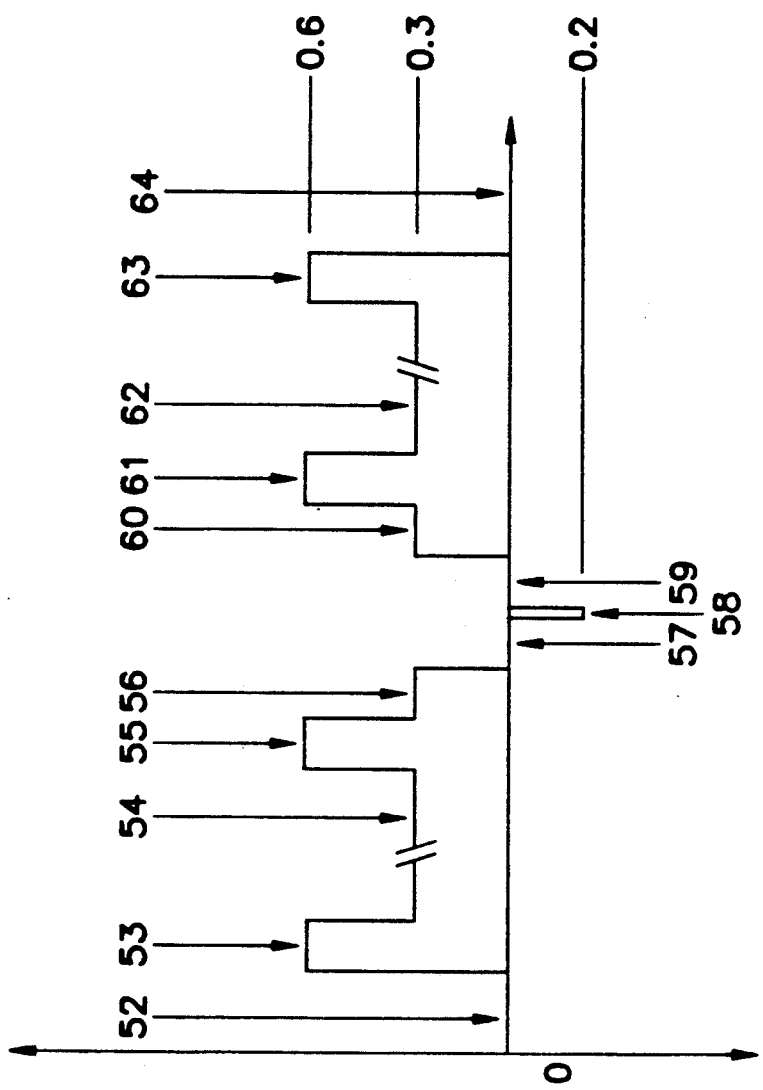
FIG. 5 is a diagram showing the distribution of Al mixed crystal component in the thickness direction of the laser diode of the second embodiment.
Figure 6:
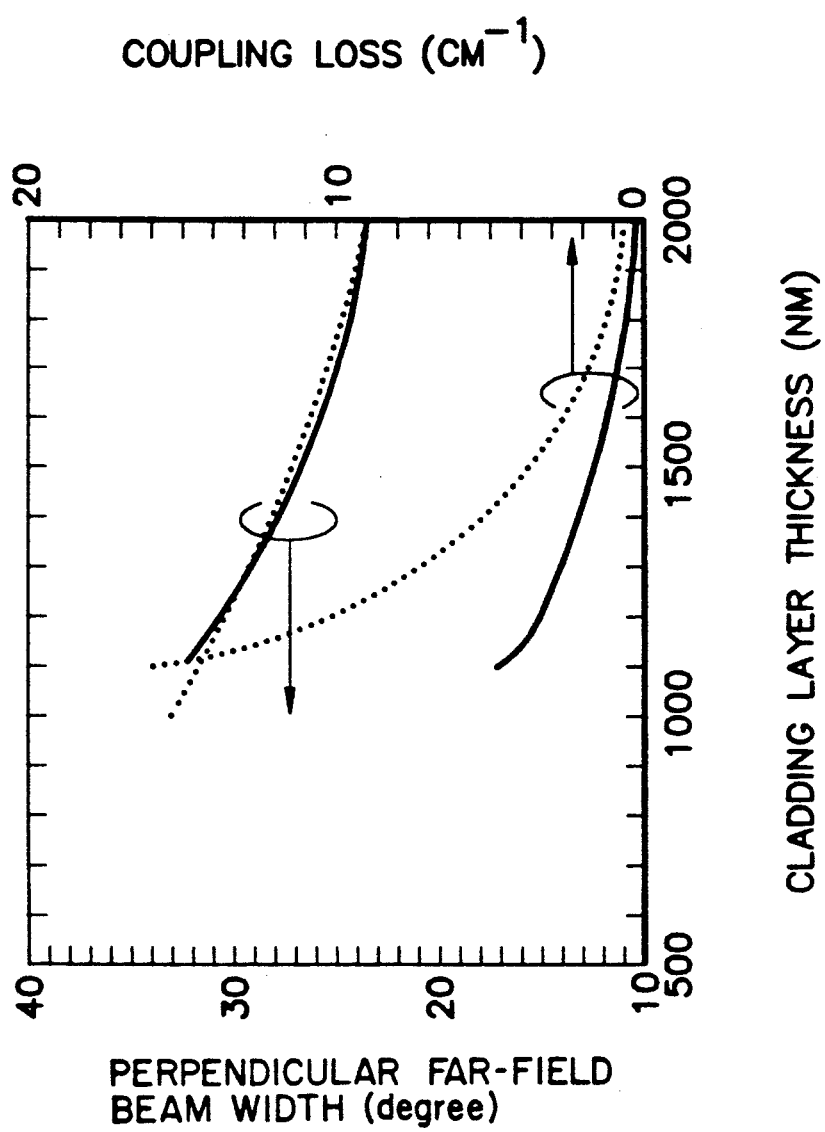
FIG. 6 is a graph illustrating the relationship between the thickness of the cladding layers, the full-width at half maximum of the far-field image in the perpendicular direction, and the coupling loss.

The wafer thus fabricated was cleaved to form a resonator 500 μm long, and electron-beam deposition was then used to provide the front end with an $Al_2O_3$ coating having a reflectance of 10% and the rear end with a multilayer coating of 95%-reflectance $Al_2O_3$ followed by amorphous silicon, this sequence being then repeated. The wafer was then cut into chips 500 μm wide which were then each In-soldered onto a copper heat sink and the characteristics were measured. At 25° C. the device oscillated at a threshold current of 60 mA, producing an optical output of 500 mW from the front end; oscillation wavelength was around 975 nm. Far-field image measurement from the front end showed a relatively small full-width at half maximum of around 28 degrees in the perpendicular direction. Because of the multimode operation, in the horizontal direction the far-field image had multiple peaks and a full-width at half maximum of around 10 degrees. In the case of this embodiment, the GaAs layer absorption coefficient at an oscillation wavelength of 975 nm was 20 $cm^{-1}$, which is small, but the refractive index being higher than that of the AlGaAs layers has the effect of drawing in the electrical field, producing a high calculated coupling loss of several $cm^{-1}$ when thin cladding layers are used. The same calculations used for FIG. 3 were also applied to this embodiment. A GaAs absorption coefficient of 20 $cm^{-1}$ was used. The results are indicated by the solid line in FIG. 6. For the purposes of comparison, calculations were also carried out which did not include the low refractive index layers 53 and 63 of FIG. 5, and these are indicated in FIG. 6 by a wavy line. As in FIG. 3, the horizontal axis represents the total of the thickness of the outer cladding layer 54 (or 62) and low refractive index layer 53 (or 63), making the distance from the quantum well layer to the GaAs layers the same. It can be seen that adding the low refractive index layers 53 and 63 enables the coupling loss to be reduced with almost no change to the farfield image.

It is to be understood that the present invention is not limited to a laser diode formed using a GaAs substrate as used in the embodiments described above. Instead, an InP substrate may be used, for example. In such a case, the basic mixed crystal is divided broadly into $In_x Ga_{1-x}As_yP_{1-x}$ and $(Al_xGa_{1-x})_yIn_{1-x}As$. In both cases the refractive index distribution of this invention can be realized by varying the mixed crystal ratios. The invention can also be applied to an $(Al_xGa_{1-x})_yIn_{1-y}P$ laser formed on a GaAs substrate, to AlGaAsSb system and other III-V group based laser diodes, and to ZnSSe and other II-VI group laser diodes.

Figure 7:
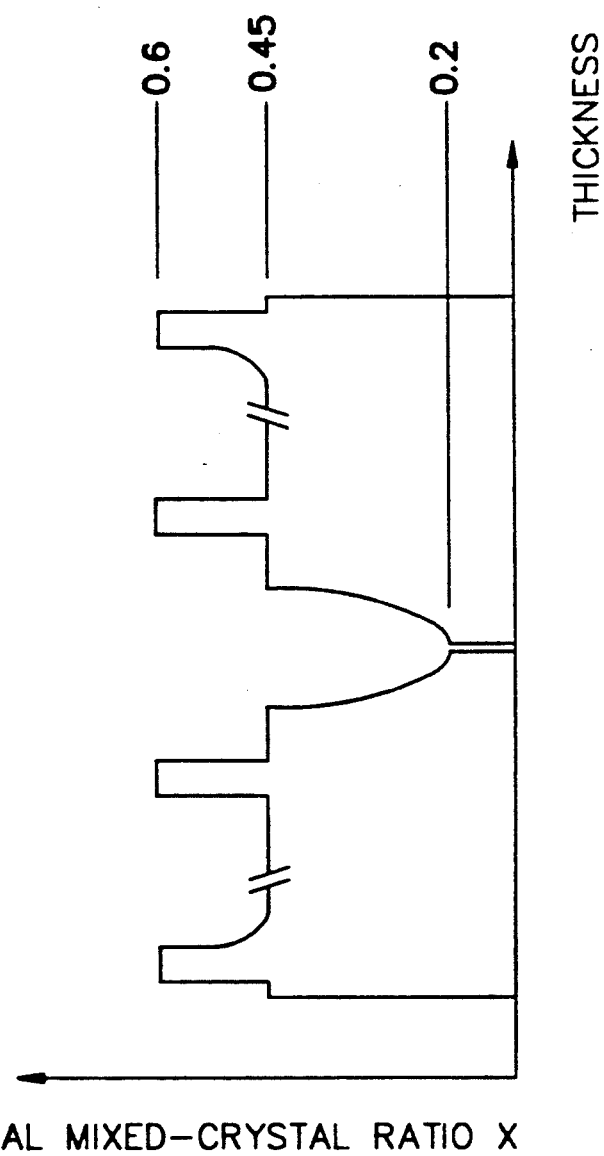
FIG. 7 is a diagram showing the distribution of the Al mixed crystal component in the thickness direction of another embodiment of the laser diode.

While the above description relates to the addition of one low refractive index layer, it to be understood that it is also possible to use a superlattice type structure comprised of alternating layers of GaAs (0.9 nm thick) and AlAs (1.5 nm thick) instead of the $Al_{0.6}Ga_{0.4}As$ layer, and multilayer structures may also be employed for the cladding and other layers. Also, instead of the single component layer arrangement illustrated by FIG. 7, a layer structure could be used in which there is a gradual change of composition, hence a gradual change of refractive index. It is to be understood that various waveguide structures can be used, starting with the basic double heterostructure arrangement and the SCH arrangement of FIGS. 1 and 3 and the GRIN-SCH arrangement of FIG. 7. While also the invention was described with reference to the addition of low refractive index layers to the cladding regions around the active layer, as indicated by the calculated results shown in FIGS. 3 and 6, as a low-loss laser with narrow far-field image can be realized by increasing the cladding layer thickness, one of the cladding regions can be provided with one low refractive index layer, or a larger cladding layer thickness can be used by providing one such layer, and the thickness of the other cladding layer region can be reduced by adding two or more low refractive index layers. In the case of a refractive index waveguide type laser, for example, fabricated closer to the wafer surface than the active layer, increasing the thickness of the cladding layer on the substrate side to 2 μm or more and providing a low refractive index layer not on the substrate side but only in the cladding region near the wafer surface to decrease the layer thickness would facilitate the fabrication process.

Moreover, although the above description was made with reference to a device having just the simplest type of electrode stripe arrangement, it is to be understood that the invention may be applied to various other stripe structures including various refractive index waveguide structures.

The invention has been described in detail with particular reference to certain preferred embodiments thereof, but it will be understood that variations and modifications can be effected within the spirit and scope of the invention.

What is claimed is:

1. An optical waveguiding multilayer structure laser diode having a quantum well active layer and bounded by a resonator structure perpendicular thereto, comprising:
   (a) an optical waveguiding region adjacent to the active layer having at least one high refractive index layer;
   (b) two spaced cladding regions that sandwich between them the optical waveguiding region and the active layer, each cladding region including: a first cladding layer adjacent to the waveguiding region and having a lower refractive index than the waveguiding region; a first low refractive index layer having a refractive index lower than the first cladding layer; a second cladding layer adjacent to the first low refractive index layer and a second low refractive index layer adjacent to the second cladding layer and having a refractive index lower than the first low refractive index layer; and
   (c) a low refractive index electrode layered structure connected to each cladding region, with each layer of the electrode structure having a lower index of refraction than any of the cladding region layers.

2. The laser diode of claim 1 wherein the optical waveguiding region includes two high refractive index layers which sandwich between them a higher refractive index quantum well active layer.

* * * * *